United States Patent

Cima

(10) Patent No.: US 11,892,475 B2
(45) Date of Patent: Feb. 6, 2024

(54) TWO-IN-ONE COIL CURRENT SENSOR

(71) Applicant: SAFRAN ELECTRICAL & POWER, Blagnac (FR)

(72) Inventor: Lionel Cima, Moissy-Cramayel (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 0 days.

(21) Appl. No.: 18/257,510

(22) PCT Filed: Dec. 7, 2021

(86) PCT No.: PCT/FR2021/052227
§ 371 (c)(1),
(2) Date: Jun. 14, 2023

(87) PCT Pub. No.: WO2022/129732
PCT Pub. Date: Jun. 23, 2022

(65) Prior Publication Data
US 2023/0408552 A1    Dec. 21, 2023

(30) Foreign Application Priority Data

Dec. 14, 2020   (FR) ..................... 2013172

(51) Int. Cl.
*G01R 15/18*   (2006.01)
*G01R 19/00*   (2006.01)

(52) U.S. Cl.
CPC ....... *G01R 15/181* (2013.01); *G01R 19/0092* (2013.01)

(58) Field of Classification Search
CPC ............................. G01R 15/81; G01R 19/0092
See application file for complete search history.

(56) References Cited

U.S. PATENT DOCUMENTS 8,076,931 B2 * 12/2011 Lenglet .................. G01R 33/04
                                                               335/297
2008/0303511 A1    12/2008 Grno
(Continued)

FOREIGN PATENT DOCUMENTS

EP      2905627 A1    8/2015
EP      3314281 B1    9/2019
(Continued)

OTHER PUBLICATIONS

Marracci Mirko et al. "Study and characterization of a Rogowski coil with superparamagnetic magnetite core" 2017 IEEE International Instrumentation and Measurement Technology Conference (I2MTC), IEEE, May 22, 2017 (May 22, 2017). pp. 1-6, DOI: 10.1109/I2MTC.2017.7969951, XP033115182.
(Continued)

*Primary Examiner* — Dominic E Hawkins
(74) *Attorney, Agent, or Firm* — Bookoff McAndrews, PLLC (57) ABSTRACT

Current sensor comprising:
one pair, of identical electrical coils with superparamagnetic cores and surrounded by a common shielding braid;
a direct current excitation means configured to make a direct current flow in at least one of the coils of the pair of coils and a means of adjusting an intensity of the direct current;
a first alternating current excitation means configured to make an alternating current flow at a first frequency in the coils of the pair that the direct current flows through;
a second alternating current excitation means configured to make an alternating current flow at a second frequency greater than the first frequency in the two coils of the pair of coils;
(Continued)

a means of measuring an electromotive force of the Noel Effect® type at the terminals of the two coils of the pair.

6 Claims, 4 Drawing Sheets

(56) References Cited

U.S. PATENT DOCUMENTS

2017/0082690 A1* 3/2017 Klapper ............... H02B 13/065
2020/0011900 A1* 1/2020 Cima ................. G01R 33/0052

FOREIGN PATENT DOCUMENTS

EP          3092500 B1   10/2019
ES          2438618 A1    1/2014

OTHER PUBLICATIONS

Search Report and Written Opinion issued in International Application No. PCT/FR2021/052227, dated Jun. 23, 2022.
Search Report issued in French Application No. 20 13172, dated Aug. 12, 2021.

* cited by examiner

TWO-IN-ONE COIL CURRENT SENSOR

CROSS-REFERENCE TO RELATED APPLICATIONS

This is a National Stage Application under 35 U.S.C. § 371 of International Application No. PCT/FR2021/052227, filed Dec. 7, 2021, now published as WO 2022/129732 A1, which claims priority to French Patent Application No. 2013172, filed on Dec. 14, 2020.

TECHNICAL FIELD

The present invention relates to the general field of current sensors and more particularly to a current sensor allowing two current measurements to be carried out.

PRIOR ART

In order to measure currents in conductors, sensors of the Néel Effect® type or of the Rogowski type are used. Néel Effect® technology has little sensitivity to exterior fields. It allows measuring direct currents. While the Rogowski technology allows measuring alternating currents and creating compact sensors insensitive to the direct components of the current due to the fact of the absence of a magnetic core, and covering a wide range of frequencies. Nevertheless, sensors of the Rogowski type are sensitive to variations in temperature.

A sensor of the Néel Effect® type, as described in patent EP 3 314 281, comprises two pairs of coils with cores that have a direct current and two alternating currents with different frequencies flowing through them in order to improve the signal-to-noise ratio of the sensor and thus measure small current values. In order to increase the pass band of the sensor and to measure alternating currents, it is possible to add to it a measurement of the Rogowski type. Nevertheless, the coils of this sensor cannot be used to accomplish both types of measurement due to the fact of their triple current excitation. It is therefore necessary to add additional coils for Rogowski type measurement, which makes the sensor bulkier and more expensive.

It is therefore desirable to have a compact current sensor, insensitive to temperature and allowing double current measurement to be accomplished.

DISCLOSURE OF THE INVENTION

The invention relates to a current sensor comprising:
one pair of identical electrical coils with superparamagnetic cores and surrounded by a common shielding braid;
a direct current excitation means configured to make a direct current flow in at least one of the coils of the pair of coils and a means for adjusting an intensity of the direct current;
a first alternating current excitation means configured to make an alternating current at a first frequency flow in the coils of the pair that the direct current flows through;
a second alternating current excitation means configured to make an alternating current flow at a second frequency greater than the first frequency in both coils of the pair of coils; and
a means of measuring an electromotive force of the Néel Effect® type at the terminals of both coils of the pair.

The cores are superparamagnetic, which signifies that the material composing them is a nonlinear magnetic material which shows no hysteresis when the magnetic field applied to this material varies periodically. The material constituting the core is, for example, a composite filled with superparamagnetic nanoparticles.

The current sensor according to the invention allows determining a current flowing through a conductor placed in the center of the coils or in proximity to the coils.

The means for measuring an electromotive force of the Néel Effect® type allows measuring an electrical voltage component existing at the terminals of the two coils of the pair. The electromotive force of the Néel Effect® type that is measured is proportional to the difference between the current that it is desired to determine and the feedback current generated by the direct current excitation means. Thus, by varying the direct excitation current (i.e. the feedback current), it is possible to cancel the measured electromotive force of the Néel Effect® type and thus determine the direct component of the current value sought.

The current sensor according to the invention thus allows accomplishing current measurement with a single pair of coils. This allows obtaining a more compact, less expensive sensor that is more economical of energy than that presented in patent EP 3 314 281, which is advantageous, and in particular for measuring strong currents, for example currents greater than 50 A.

According to one embodiment of the invention, the sensor also comprises a second pair of electrical coils with superparamagnetic cores identical to the first pair, the excitation means being, respectively, configured to make a direct current flow in at least one of the coils of the second pair, an alternating current at the first frequency in the coils of the second pair that the direct current flows through and an alternating current at the second frequency in both coils of the second pair.

This second pair allows for example increasing the signal-to-noise ratio and thus improving the measurements of electromotive force and therefore of current.

According to one embodiment of the invention, the sensor also comprises a means for measuring an electromotive force of the Rogowski type at the terminals of at least one coil of one of the pairs that the direct current and the alternating current at the first frequency do not flow through.

The presence of a measuring means of the Rogowski type allows accomplishing a double current measurement: a first based on the Néel Effect® and a second based on the Rogowski effect. The measured electromotive force of the Rogowski type is proportional to the time derivative of the current that it is desired to determine. Thus the current sensor allows determining both the direct component and the alternating component of the current being sought. The coil that the direct current does not flow through and that is used for the measuring of the electromotive force of the Rogowski type allows eliminating the Rogowski effect in the measuring of the electromotive force according to the Néel Effect®.

In addition, by adding a second pair of coils, a differential measurement of current according to the Rogowski effect is possible.

According to a particular feature of the invention, the sensor comprises an automatic means of correcting a sensitivity of the means of measuring an electromotive force of the Rogowski type.

The sensitivity of measuring an electromotive force of the Rogowski type, hence of a sensor of the Rogowski type, is proportional to the mutual inductance between the conductor in which the current to be measured flows and the measuring coils. This mutual inductance is the same for all the coils, whether they are used for measuring an electromotive force of the Néel Effect® type or of the Rogowski type. Yet the mutual inductance varies slightly depending on the temperature, particularly due to a dilation of the cross section of the turns of the coils. This phenomenon is relatively weak, but becomes visible when a current sensor is sought that is accurate over a large range of temperature, for example between −40° C. and +85° C. Thus the means of correction allows automatically correcting the sensitivity of measuring the electromotive force of the Rogowski type to obtain a current sensor that is insensitive to temperature.

According to one embodiment of the invention, the sensor comprises two pairs of coils as well as a means of measuring an electromotive force of the Rogowski type, as described previously, and the direct current excitation means and the first alternating current excitation means are configured to make a direct current and an alternating current, respectively, at the first frequency flow in only one of the coils of each pair, and the means for measuring an electromotive force of the Rogowski type comprises two inputs connected to each coil of each pair that the direct current and the alternating current at the first frequency do not flow through.

The two inputs of the means of measuring an electromotive force of the Rogowski type, each connected to one of the coils of the two pairs, allow accomplishing a differential measurement of this electromotive force. The differential measurement allows improving the immunity of the sensor in a severe electromagnetic environment.

According to one embodiment of the invention, the sensor comprises two pairs of coils as previously described, and also two direct current excitation means each configured to make a direct current flow in the coils of each pair, means for adjusting an intensity of the direct excitation currents, and two means of measuring an electromotive force of the Néel Effect® type at the terminals of the two coils of each pair.

The presence of two direct current excitation means and of the two means of measuring a component of a voltage thus allow accomplishing a double current measurement by measuring two electromotive forces according to the Néel Effect®. It is thus possible, for example, based on the residual currents (or common mode current) and network currents (or differential mode current) of an electrical network, to generate two feedback currents which will supply two distinct measurements of electromotive force according to the Néel Effect®. This allows attenuating the effects of non-linearity due to the inhomogeneity of the magnetic fields in the two pairs of coils.

According to one embodiment of the invention, the current sensor comprises:
  four identical pairs of electrical coils; within each pair, the coils have superparamagnetic cores and each pair is surrounded by a shielding braid common to the two coils of the pair;
  two direct current excitation means, each being configured to make a direct current flow in only one of the coils of each pair, and at least one means of adjusting an intensity of the direct current supplied by each direct current excitation means;
  a first alternating current excitation means configured to make an alternating current flow at a first frequency in the coils of each pair that the direct excitation currents flow through;
  a second alternating current excitation means configured to make an alternating current at a second frequency greater than the first frequency flow in both coils of each pair;
  two means of measuring an electromotive force of the Néel Effect® type, the first measuring means being configured to measure a said electromotive force of the Néel Effect® type at the terminals of the coils of two first pairs, and the second measuring means being configured to measure a said electromotive force of the Néel Effect® type at the terminals of the coils of the two other pairs; and
  two means of measuring an electromotive force of the Rogowski type at the terminals of a coil that a direct current does not flow through, the two means each comprising two inputs, the inputs of the first being connected to the coils that the direct excitation currents do not flow through of the two first pairs and the inputs of the second being connected to the coils that the direct excitation currents do not flow through of the two other pairs.

This allows accomplishing two measurements of the electromotive force of the Néel Effect® type, and two differential measurements of an electromotive force of the Rogowski type. Thus there are two completely distinct transducers, each transducer comprising two pairs of coils and two means of measuring an electromotive force according to the Néel effect and of the Rogowski type, within the sensor. One of the transducers is dedicated for example to the measuring of a residual current and the other to the measuring of a network current of an electrical network, while pooling the current excitation means for the two transducers.

According to a particular feature of the invention, the first frequency is a low frequency, i.e. it is comprised between 10 Hz and 100 kHz.

According to another particular feature of the invention, the second frequency is a high frequency, i.e. it is greater than 100 kHz.

Another object of the invention is a method for measuring a current flowing in a conductor comprising the following steps:
  arranging the pairs of coils of a current sensor according to the invention around the conductor that the current that it is desired to measure flows through;
  activating simultaneously the first and second alternating current excitation means and the direct current excitation means, and adjusting the intensity of the direct currents of the direct current excitation means so as to cancel an amplitude of a measured electromotive force of the Néel Effect® type.

The method according to the invention allows determining a current flowing in a conductor due to the use of a current sensor according to the invention, particularly at least the direct component and possibly the alternating component if a means of measuring an electromotive force of the Rogowski type is present in the sensor.

BRIEF DESCRIPTION OF THE DRAWINGS

Other features and advantages of the present invention will be revealed by the description given below, with reference to the appended drawings which illustrate embodiments of it bereft of any limiting nature.

DESCRIPTION OF THE EMBODIMENTS

Figure 1:
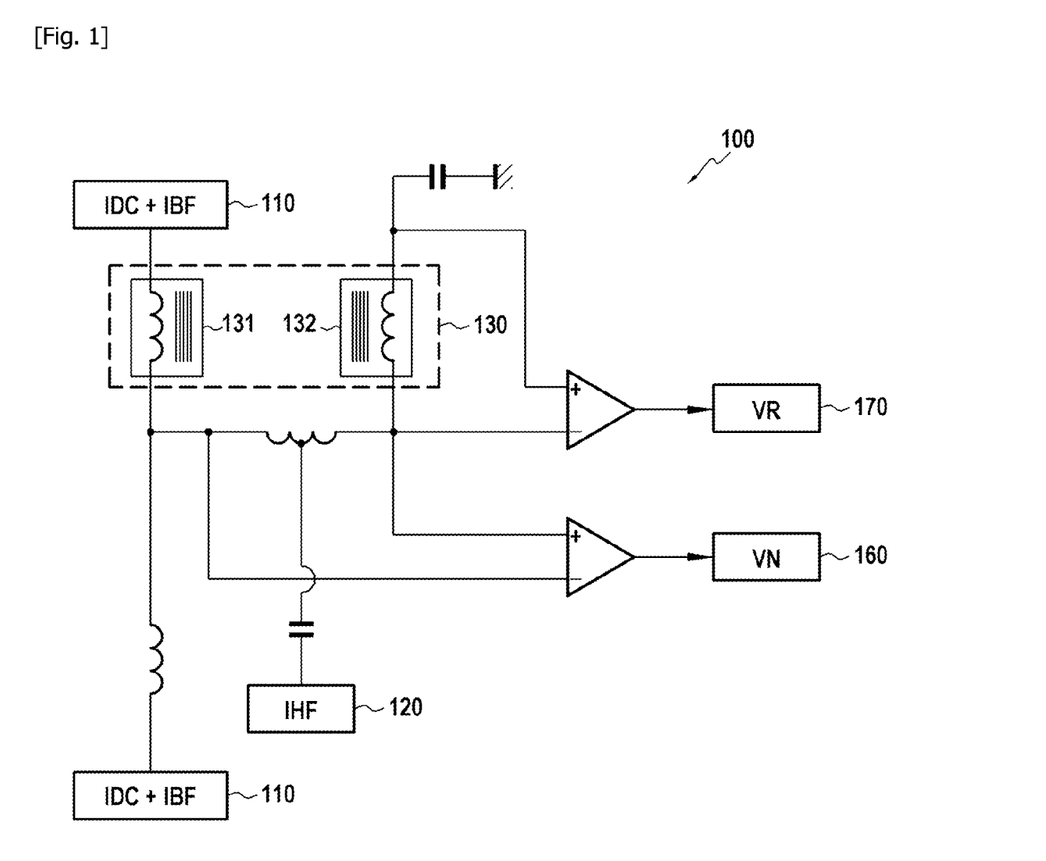
FIG. 1 shows, schematically and partially, a current sensor according to one embodiment of the invention comprising a means for measuring an electromotive force of the Néel Effect® type and a means for measuring an electromotive force of the Rogowski type.

FIG. 1 shows, schematically and partially, a current sensor according to a first embodiment of the invention.

The sensor 100 comprises a pair 130 of coils 131, 132. The two coils 131, 132 are identical and each comprises a superparamagnetic core. The two coils 131, 132 are surrounded by a common shielding braid, in order to confer immunity to electromagnetic perturbations to the coils 131, 132. The sensor 100 also comprises three means using current for exciting the coils 131, 132. The excitation means 110 is a direct current IDC and alternating current IBF excitation means at a first frequency for the coil 131 of the pair of coils 130. The excitation means 120 is an alternating current IHF excitation means at a second frequency greater than the first frequency for each coils 131 and 132 of the pair 130 of coils. Thus a direct current and two alternating currents at the first and second frequencies flow through the coil 131, and only an alternating current at the second frequency flows through the coils 132.

The sensor 100 also comprises two means of measuring an electromotive force: the first 160 allows measuring an electromotive force according to the Néel Effect® and the second 170 allows measuring an electromotive force of the Rogowski type. The first means of measurement 160 measures an electromotive force VN at the terminals of the two coils 131 and 132. While the second measuring means 170 measures an electromotive force VR at the terminals of the coil 132 that only the alternating current at the second frequency flows through.

Figure 2:
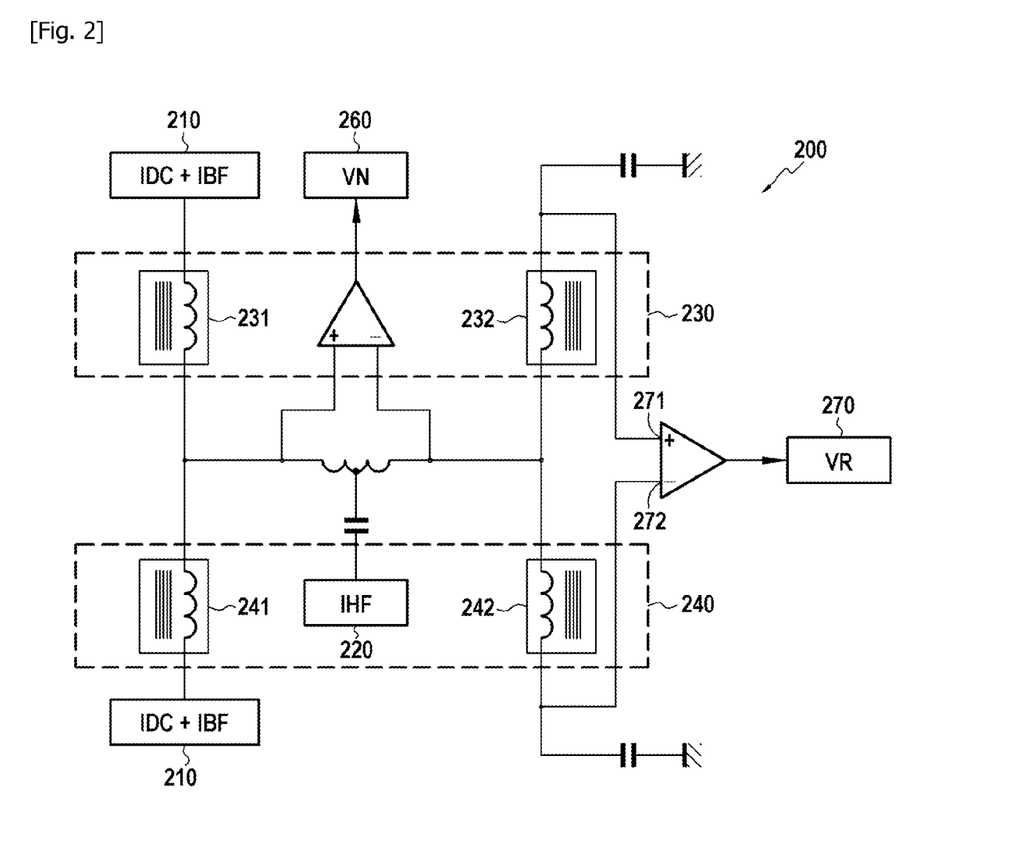
FIG. 2 shows, schematically and partially, a current sensor according to one embodiment of the invention comprising a means of measuring an electromotive force of the Néel Effect® type and a differential means of measuring an electromotive force of the Rogowski type.

FIG. 2 shows, in a schematic and partial manner, a current sensor according to a second embodiment of the invention.

The sensor 200 comprises two pairs 230, 240 of coils 231, 232, 241 and 242. The four coils 231, 232, 241 and 242 are identical and each comprises a superparamagnetic core. The two coils 231, 232 or 241, 242 of the same pair 230 or 240 are surrounded with a common shielding braid in order to confer immunity to electromagnetic perturbations on the coils. The sensor 200 also comprises three means using current to excite coils 231, 232, 241 and 242. The excitation means 210 is a direct current ICD and alternating current IBF excitation means at a first frequency for the coil 231 of the pair of coils 230 and for the coil 241 of the pair of coils 240. The excitation means 220 is an alternating current IHF excitation means at a second frequency greater than the first frequency for all the coils 231, 232, 241 and 242 of the two pairs 230, 240. Thus a direct current and two alternating currents at the first and second frequencies flow through the coils 231 and 241, and only an alternating current at the second frequency flows through the coils 232 and 242.

The sensor 200 also comprises two means of measuring an electromotive force: the first 260 allows measuring an electromotive force according to the Néel Effect® and the second 270 allows measuring an electromotive force of the Rogowski type. The measuring means 270 of the Rogowski type comprises two inputs 271 and 272 each connected to a coil that the direct current does not flow through. Thus, the input 271 is connected to the coil 232 and the input 272 is connected to the coil 242. The first measuring means 260 thus measures an electromotive force VN at the terminals of the two coils 231, 232 and 241, 242 of each pair 230, 240. While the second measuring means 270 differentially measures an electromotive force VR at the terminals of the coils 232 and 242 that only the alternating current at the second frequency flows through.

Compared to the sensor 100 of FIG. 1, this one allows accomplishing a differential measurement of the electromotive force of the Rogowski type and increasing the power of the signal due to the two pairs 230, 240 of coils 231, 232, 241 and 242 for measuring the electromotive force according to the Néel Effect®.

Figure 3:
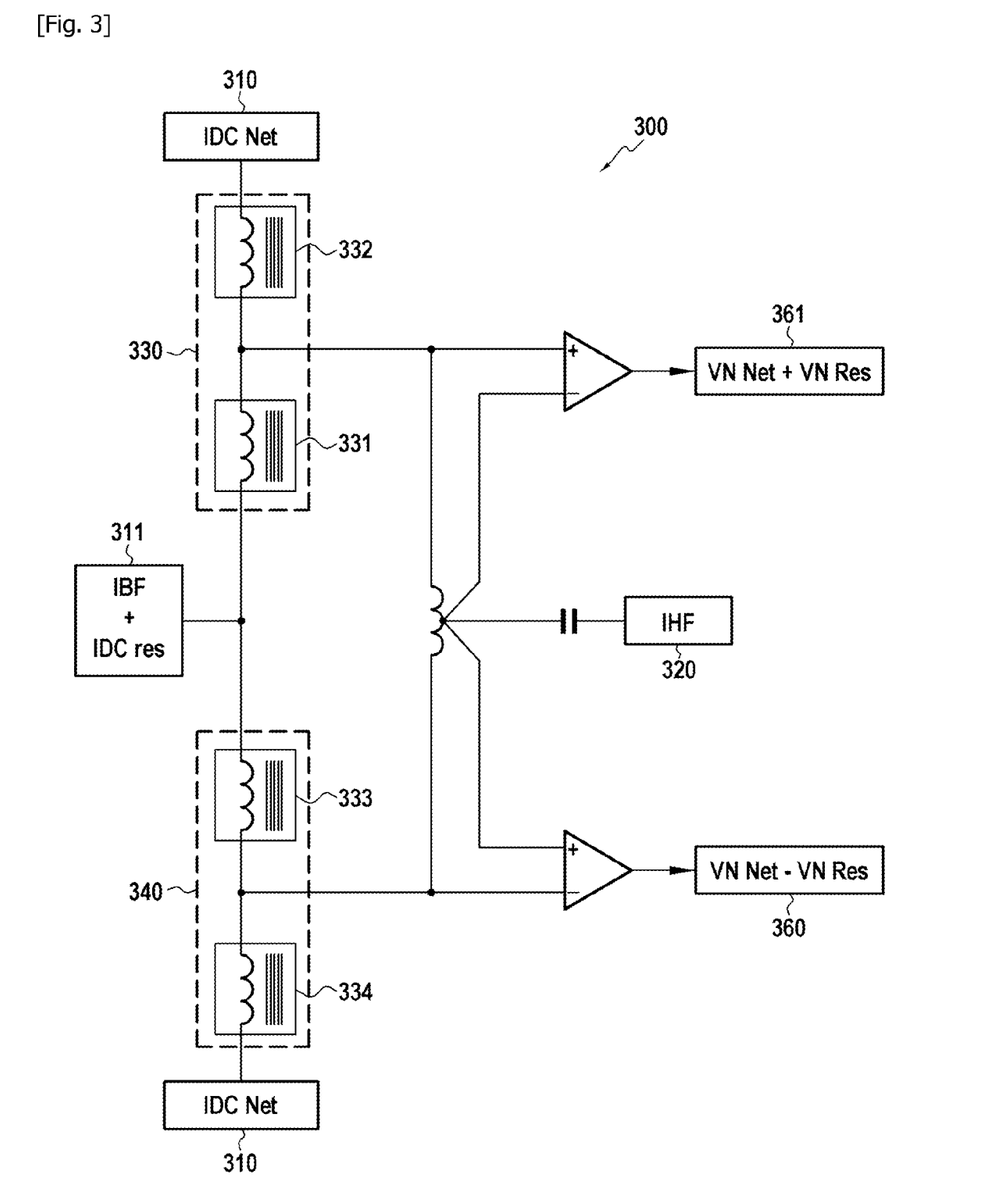
FIG. 3 shows, schematically and partially, a current sensor according to one embodiment of the invention comprising two means of measuring an electromotive force of the Néel Effect® type.

FIG. 3 shows, in a schematic and partial manner, a current sensor according to a third embodiment of the invention.

The sensor 300 comprises two pairs 330, 340 of coils 331, 332, 333 and 334. The four coils 331, 332, 333 and 334 are identical and each comprises a superparamagnetic core. The two coils of the same pair are surrounded by a common shielding braid, in order to confer immunity to electromagnetic perturbations to the coils. The sensor 300 also comprises four means using current to excite the coils 331 to 334. The excitation means 311 is a direct current IDC Res and an alternating current IBF excitation means at a first frequency for all the coils 331, 332, 333, 334 of the two pairs 330 and 340. The excitation means 310 is a direct current IDC Net excitation means for all the coils 331 to 334 of the two pairs 330 and 340. The excitation means 320 is an alternating current IHF excitation means at a second frequency greater than the first frequency for all the coils 331 to 334. Thus two direct currents and two alternating currents at the first and second frequencies flow through the four coils.

The sensor 300 also comprises two means 360 and 361 for measuring an electromotive force according to the Néel Effect®. The first means 361 allows measuring an electromotive force VN Net+VN Res proportional to the sum of the two direct currents, while the second 360 allows measuring an electromotive force VN Net−VN Res proportional to the difference between the two direct currents. Thus, by summing or subtracting these two electromotive forces, it is possible to determine the current flowing in a conductor placed in proximity to the coils or in the center of the coils. The two direct excitation currents are, for example, the network and residual currents of an electrical network.

Figure 4:
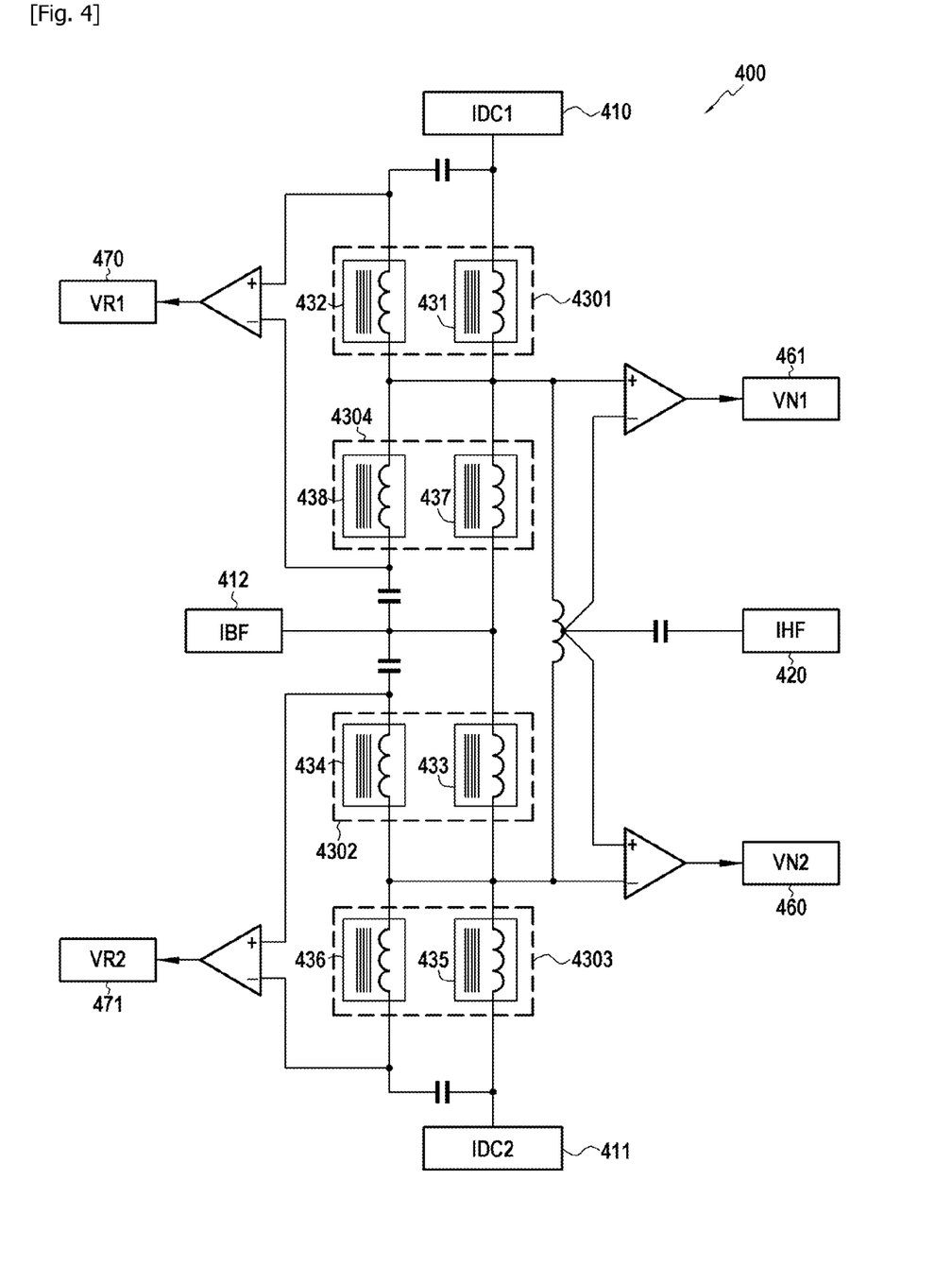
FIG. 4 shows, schematically and partially, a current sensor according to one embodiment of the invention comprising two means of measuring an electromotive force of the Néel Effect® type and two differential means of measuring an electromotive force of the Rogowski type.

FIG. 4 shows, in a schematic and partial manner, a current sensor according to a fourth embodiment of the invention.

The sensor 400 comprises four pairs 4301, 4302, 4303, 4304 of coils 431 to 438. The eight coils are identical and each comprises a superparamagnetic core. The first pair 4301 thus comprises the coils 431 and 432, the second pair 4302 comprises the coils 433 and 434, the third pair 4303 comprises the coils 435 and 436 and the fourth pair 4304 comprises the coils 437 and 438. The two coils of each pair are surrounded by a common shielding braid, in order to confer immunity to electromagnetic perturbations to the coils.

The sensor 400 also comprises four excitation means of the cores of the coils using current. The excitation means 410 is a direct current IDC1 excitation means, the excitation means 411 is a direct current IDC2 excitation means, the excitation means 412 is an alternating current IBF excitation means at a first frequency, and the excitation means 420 is an alternating current excitation means at a second frequency greater than the first frequency.

The excitation means 410 allows making the direct current IDC1 flow in only one of the coils 431, 433, 435 and 437 of each pair 4301 to 4304. The excitation means 411 allows making the direct current IDC2 flow in only one of the coils 431, 433, 435 and 437 of each pair 4301 to 4304. The excitation means 412 allows making the alternating current IBF flow at a first frequency in the coils 431, 433, 435 and 437 of the pairs that the direct excitation currents IDC1 and IDC2 flow through.

The excitation means 420 allows making an alternating current IHF flow at a second frequency greater than the first frequency in all the coils 431 to 438 of each pair 4301 to 4304 of coils.

The sensor 400 also comprises four means for measuring an electromotive force: two measuring means 460 and 461 allow measuring an electromotive force according to the Néel Effect® in both coils of each pair and the two others 470 and 471 allow measuring an electromotive force of the Rogowski type in the coils that the direct currents do not flow through. Thus the means 461 measures an electromotive force VN1 according to the Néel Effect® in the coils 431, 432, 437 and 438 of the pairs 4301 and 4304, while the means 460 measures an electromotive force VN2 according to the Néel Effect® in the coils 433, 434, 435 and 436 of the pairs 4302 and 4303. The means 470 measures an electromotive force VR1 of the Rogowski type in the coils 432 and 438 of the pairs 4301 and 4304, while the means 471 measures an electromotive force VR2 of the Rogowski type in the coils 434 and 436 of the pairs 4302 and 4303. The two means 470 and 471 each comprise two inputs so as to accomplish a differential measurement.

In all the embodiments described, the current sensor also comprises at least one means of adjusting the intensity of the direct excitation current(s). This will allow cancelling the electromotive force according to the Néel Effect® and thus determine the direct component of the current that is sought.

In all the embodiments, the current sensor can comprise one or more means of measuring the direct excitation current supplied by one or more direct current excitation means of the sensor.

In all the embodiments comprising a means of measuring an electromotive force of the Rogowski type, the sensor can comprise a means of automatically correcting the sensitivity of this measuring means.

The correction means can, for example, correct the thermal drift of the measuring means of the Rogowski type due to the measurement of the inductance of the coils that a direct current flows through. In fact, the coils all being identical and at the same ambient temperature, they have identical mutual inductance. Staring with the measurement of the impedance, in particular the inductance of the coils that a direct current flows through, it is possible to determine the transformation ratio of the measuring means of the Rogowski type and thus correct the temperature drift and the sensitivity of this measuring means.

A sensor according to the invention thus allows measuring a current flowing in a conductor. The associated measuring method comprises the following steps:

arranging the pairs of coils of a current sensor according to the invention around the conductor that the current that it is desired to measure flows in;

activating simultaneously the first and second alternating current excitation means and the direct current excitation means, and adjusting the intensity of the direct currents of the direct current excitation means so as to cancel an amplitude of the electromotive force of the Néel Effect® type that was measured.

By cancelling the amplitude of the electromotive force of the Néel Effect® type, it is possible to thus determine the direct component of the current flowing in the conductor, which will be equal to the feedback current, i.e. to the current generated by the direct current excitation means of the sensor.

The invention claimed is:

1. A current sensor comprising:
   one pair of identical electrical coils with superparamagnetic cores and surrounded by a common shielding braid;
   a direct current excitation means configured to make a direct current flow in at least one of the coils of the pair of coils and a means for adjusting an intensity of the direct current;
   a first alternating current excitation means configured to make an alternating current flow at a first frequency in the coils of the pair that the direct current flows through;
   a second alternating current excitation means configured to make an alternating current flow at a second frequency greater than the first frequency in both coils of the pair of coils;
   a means of measuring an electromotive force of the Néel Effect® type at the terminals of the two coils of the pair, and
   a means of measuring an electromotive force of the Rogowski type at the terminals of at least one of the coils of one of the pairs that the direct current and the alternating current does not flow through at the first frequency.

2. The current sensor according to claim 1, also comprising a second pair of electrical coils with superparamagnetic cores identical to the first pair, the excitation means being, respectively, configured to make a direct current flow in at least one of the coils of the second pair, an alternating current at the first frequency in the coils of the second pair that the direct current flows through and an alternating current at the second frequency in both coils of the second pair.

3. The current sensor according to claim 1, comprising an automatic means of correcting a sensitivity of the means for measuring an electromotive force of the Rogowski type.

4. The current sensor according to claim 1, wherein the direct current excitation means and the first alternating current excitation means are configured to make a direct current and an alternating current, respectively, flow at the first frequency in only one of the coils of each pair, and the means of measuring an electromotive force of the Rogowski type comprises two inputs connected to each coil of each pair that the direct current and the alternating current at the first frequency do not flow through.

5. The current sensor according to claim 1, comprising:
   four identical pairs of electrical coils; within each pair, the coils have superparamagnetic cores and each pair is surrounded by a shielding braid common to the coils of the pair;

two direct current excitation means, each being configured to make a direct current flow in only one of the coils of each pair, and at least one means of adjusting an intensity of the direct current supplied by each direct current excitation means;

a first alternating current excitation means configured to make an alternating current flow at a first frequency in the coils of each pair that the direct excitation currents flow through;

a second alternating current excitation means configured to make an alternating current at a second frequency greater than the first frequency flow in both coils of each pair of coils;

two means of measuring an electromotive force of the Néel Effect® type, the first measuring means being configured to measure a said electromotive force of the Néel Effect® type at the terminals of the coils of two first pairs and the second measuring means being configured to measure a said electromotive force of the Néel Effect® type at the terminals of the coils of the two other pairs; and two means of measuring an electromotive force of the Rogowski type at the terminals of two coils that a direct current does not flow through, the two means each comprising two inputs, the inputs of the first being connected to the coils that the direct excitation currents do not flow through of the two first pairs and the inputs of the second being connected to the coils that the direct excitation currents do not flow through of the two other pairs.

6. A method for measuring a current flowing in a conductor, comprising the following steps:

arranging the pairs of coils of a current sensor according to claim 1 around the conductor that the current that it is desired to measure flows through;

activating simultaneously the first and second alternating current excitation means and the direct current excitation means, and adjusting the intensity of the direct currents of the direct current excitation means, so as to cancel an amplitude of a measured electromotive force of the Néel Effect® type.

* * * * *